(12) United States Patent
Lin

(10) Patent No.: US 9,459,328 B2
(45) Date of Patent: Oct. 4, 2016

(54) APPARATUS FOR SIMULATING BATTERY

(71) Applicant: Chih-Yang Lin, Taipei (TW)

(72) Inventor: Chih-Yang Lin, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 93 days.

(21) Appl. No.: 14/521,424

(22) Filed: Oct. 22, 2014

(65) Prior Publication Data

US 2015/0115996 A1   Apr. 30, 2015

Related U.S. Application Data

(60) Provisional application No. 61/896,599, filed on Oct. 28, 2013.

(51) Int. Cl.
*G01R 31/40* (2014.01)
*G01R 31/04* (2006.01)
*G01R 31/28* (2006.01)
*G06F 1/26* (2006.01)

(52) U.S. Cl.
CPC .......... *G01R 31/40* (2013.01); *G01R 31/041* (2013.01); *G01R 31/2848* (2013.01); *G06F 1/26* (2013.01)

(58) Field of Classification Search
CPC .......... G01R 31/3662; G01R 31/40; G01R 31/3679; G01R 31/3693; G01R 31/3648; G01R 31/3658; G01R 15/142; G01R 19/16542; G01R 31/027; G01R 31/028; G01R 31/3004; G01R 31/31721; G01R 31/34; G01R 31/362
See application file for complete search history.

(56) References Cited

U.S. PATENT DOCUMENTS 4,401,942 A * 8/1983 Renz ............... H02H 3/365
                                              324/427
6,081,100 A * 6/2000 Guthrie ............ H01M 10/46
                                              320/135

FOREIGN PATENT DOCUMENTS

TW         201217813         5/2012

OTHER PUBLICATIONS

"Office Action of Taiwan Counterpart Application", issued on Sep. 21, 2015, p. 1-p. 6.

* cited by examiner

*Primary Examiner* — Tung X Nguyen
(74) *Attorney, Agent, or Firm* — Jianq Chyun IP Office

(57) ABSTRACT

An apparatus for simulating a battery is provided. The apparatus includes a power supplying unit, a state regulating unit and an impedance unit. The power supplying unit is coupled to a power terminal of a battery interface and determines whether to provide an operation voltage to the power terminal according to a device voltage provided by the power terminal. The state regulating unit is coupled to the power terminal to provide a impedance regulating signal. The impedance unit is coupled between the power terminal and a ground voltage and is coupled to the state regulating unit to receive the impedance regulating signal. The impedance unit regulates an impedance thereof according to the impedance regulating signal.

10 Claims, 2 Drawing Sheets

APPARATUS FOR SIMULATING BATTERY

CROSS-REFERENCE TO RELATED APPLICATION

This application claims the priority benefit of U.S. provisional application Ser. No. 61/896,599, filed on Oct. 28, 2013. The entirety of the above-mentioned patent application is hereby incorporated by reference herein and made a part of this specification.

BACKGROUND

1. Technical Field

The invention relates to a simulation apparatus, and particularly relates to an apparatus for simulating battery.

2. Related Art

Along with progress of technology, various electronic products are developed toward a trend of high speed, high performance, lightness, slimness, shortness and smallness. Therefore, portable electronic apparatuses, for example, notebooks, etc. gradually become a mainstream, In order to facilitate user's carry and usage, a rechargeable battery is generally configured in the portable electronic apparatus to increase practicability of the electronic apparatus. Since the emphasis of the notebook is portability, test of a battery interface of the portable electronic apparatus is a key test. A conventional test method is to install a real rechargeable battery, though plug/unplug of the rechargeable battery probably damages the battery interface, and the rechargeable battery suffers wear and tear due to excessive use. Therefore, it is an important issue to effectively test the battery interface without damaging the battery interface.

SUMMARY

The invention is directed to an apparatus for simulating battery, in which a simple circuit is used to simulate operation of a battery, so as to reduce hardware cost for testing an electronic apparatus.

The invention provides an apparatus for simulating battery, which includes a power supplying unit, a state regulating unit and an impedance unit. The power supplying unit is coupled to a power terminal of a battery interface and determines whether to provide an operation voltage to the power terminal according to a device voltage provided by the power terminal. The state regulating unit is coupled to the power terminal, and provides an impedance regulating signal according to the device voltage. The impedance unit is coupled between the power terminal and a ground voltage and is coupled to the state regulating unit to receive the impedance regulating signal. The impedance unit regulates an impedance thereof according to the impedance regulating signal.

In an embodiment of the invention, the impedance unit includes a pass element and an energy storage element. The pass element is coupled between the power terminal and the ground voltage, and receives the impedance regulating signal for adjusting an impedance thereof. The energy storage element is coupled between the power terminal and the ground voltage.

In an embodiment of the invention, the pass element includes a voltage-controlled pass element.

In an embodiment of the invention, the energy storage element includes a capacitor.

In an embodiment of the invention, the state regulating unit includes an error control unit for receiving the device voltage and a first reference voltage, and providing the impedance regulating signal according to the device voltage and the first reference voltage, where the first reference voltage is greater than a rated voltage of the battery interface.

In an embodiment of the invention, when the device voltage is smaller than the first reference voltage, the pass element presents an open-circuit state.

In an embodiment of the invention, the impedance unit further includes a first resistor, where the first resistor and the pass element are connected in series between the power terminal and the ground voltage.

In an embodiment of the invention, the error control unit includes an error amplifier, a first capacitor, a second capacitor, a second resistor, a third resistor and a fourth resistor. The error amplifier has a first input terminal, a second input terminal and an output terminal, where the second input terminal receives a comparison voltage, and the output terminal provides the impedance regulating signal. The first capacitor is coupled between the first input terminal and a junction of the first resistor and the pass element. The second capacitor and the second resistor are coupled in series between the first input terminal and the junction of the first resistor and the pass element. The third resistor is coupled between the device voltage and the first input terminal. The fourth resistor is coupled between the first input terminal and the ground voltage. The comparison voltage corresponds to the first reference voltage times a voltage dividing ratio of the third resistor and the fourth resistor.

In an embodiment of the invention, the power supplying unit provides the operation voltage to the power terminal when the device voltage is smaller than a second reference voltage.

In an embodiment of the invention, the power supplying unit includes a power supply, a voltage switch and a comparator. The power supply is configured to provide the operation voltage. The voltage switch is coupled between the power terminal and the power supply, and receives a voltage providing signal. The comparator receives the device voltage and the second reference voltage for providing the voltage providing signal.

In an embodiment of the invention, the second reference voltage is smaller than a rated voltage of the battery interface.

According to the above descriptions, in the apparatus for simulating battery of the invention, the power supplying unit, the impedance unit and the state regulating unit provide the operation voltage or regulate the impedance of the impedance unit in response to a charge/discharge operation of the electronic apparatus performed on the battery, such that the electronic apparatus is capable of normally operating. In this way, the operation of the battery is simulated through a simple circuit, so as to reduce the hardware cost for testing the electronic apparatus.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
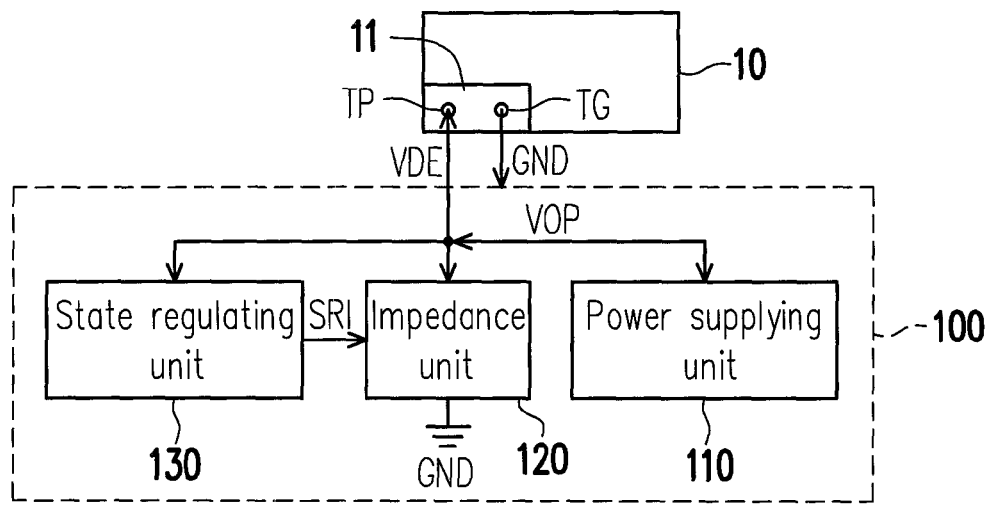
FIG. 1 is a system schematic diagram of an apparatus for simulating battery and an electronic apparatus coupled to each other according to an embodiment of the invention.

FIG. 1 is a system schematic diagram of an apparatus for simulating battery and an electronic apparatus coupled to each other according to an embodiment of the invention. Referring to FIG. 1, in the present embodiment, the apparatus for simulating battery 100 is coupled to a battery interface 11 of the electronic apparatus 10, receives a device voltage VDE a power terminal TP of the battery interface 11, and receives a ground voltage GND from a ground terminal TG of the battery interface 11. The apparatus for simulating battery 100 includes a power supplying unit 110, an impedance unit 120 and a state regulating unit 130.

The power supplying unit 110 is coupled to the power terminal TP of the battery interface 11, and determines whether to provide an operation voltage VOP to the power terminal TP according to the device voltage VDE provided by the power terminal TP.

In other words, when the device voltage VDE is smaller than a rated voltage (for example, 19V) of the battery interface 11, it represents that the electronic apparatus 10 drains power from the battery interface 11, i.e. the electronic apparatus 10 is in a battery usage state. Now, the power supplying unit 110 is required to provide the operation voltage VOP to the power terminal TP, such that the electronic apparatus 10 can normally operate. The operation voltage VOP can be the same to or close to the rated voltage of the battery interface 11. When the device voltage VDE is greater than the rated voltage (for example, 19V) of the battery interface 11, it represents that the electronic apparatus 10 does not drain power from the battery interface 11, i.e. the electronic apparatus 10 in an adaptor usage stage, such that the power supplying unit 110 stops providing the operation voltage VOP to the power terminal TP, so as to avoid influencing the operation of the electronic apparatus 10.

The impedance unit 120 is coupled between the power terminal TP and the ground voltage GND, and is coupled to the state regulating unit 130 to receive an impedance regulating signal SRI, where the impedance unit 120 regulates an impedance thereof according to the impedance regulating signal SRI. The state regulating unit 130 is coupled to the power terminal TP, and provides the impedance regulating signal SRI according to the device voltage VDE. The impedance regulating signal SRI can be a voltage signal or a pulse regulation signal, which is determined according to a design of the impedance unit 120.

In other words, when the device voltage VDE is greater than the rated voltage (for example, 19V) of the battery interface 11, it represents that the device voltage VDE charges the apparatus for simulating battery 100 (which is equivalent to battery charging), and now the state regulating unit 130 adjusts the impedance of the impedance unit 120 to approximately maintain the device voltage VDE to the rated voltage (for example, 19V) of the battery interface 11. When the device voltage VDE is smaller than the rated voltage (for example, 19V) of the battery interface 11, it represents that the electronic apparatus 10 does not provide power to the apparatus for simulating battery 100, such that the state regulating unit 130 can regulate the impedance unit 120 to present an open-circuit state, so as to reduce a power consumption of the impedance unit 120.

According to the above description, the power supplying unit 110, the impedance unit 120 and the state regulating unit 130 can provide the operation voltage VOP or regulate the impedance of the impedance unit 120 in response to a charge/discharge operation of the electronic apparatus 10 performed on the battery, such that the electronic apparatus 10 can be normally operated. Moreover, since the apparatus for simulating battery 100 is composed of circuits and is not a real battery, wear and tear of the battery is avoided.

Figure 2:
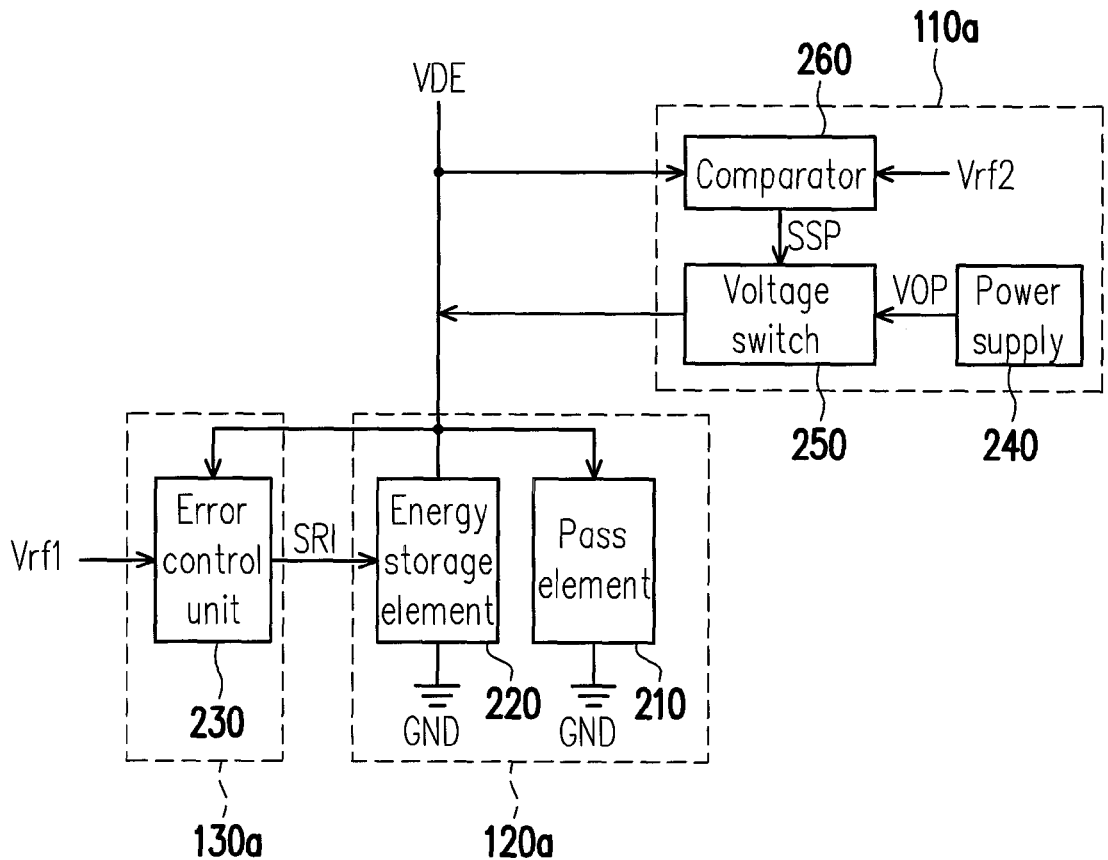
FIG. 2 is a system schematic diagram of an apparatus for simulating battery according to an embodiment of the invention.

FIG. 2 is a system schematic diagram of an apparatus for simulating battery according to an embodiment of the invention. Referring to FIG. 1 and FIG. 2, in which the same reference numbers denote the same or like components. In the present embodiment, the impedance unit 120a, for example, includes an energy storage element 210 and a pass element 220. The energy storage element 210 is, for example, a capacitor or an inductor, and is coupled between the power terminal TP and the ground voltage GND. The pass element 220 is coupled between the power terminal TP and the ground voltage GND, and receives the impedance regulating signal SRI for adjusting an impedance thereof.

The state regulating unit 130a, for example, includes an error control unit 230. The error control unit 230 receives the device voltage VDE and a first reference voltage Vref1, and provides the impedance regulating signal SRI according to the device voltage VDE and the first reference voltage Vref1, for example, a voltage level of the impedance regulating signal SRI corresponds to a voltage difference between the device voltage VDE and the first reference voltage Vref1, or a pulse width of the impedance regulating signal SRI corresponds to the voltage difference between the device voltage VDE and the first reference voltage Vref1. Moreover, when the device voltage VDE is smaller than the first reference voltage Vref1, the error control unit 230 controls the pass element 220 to present the open-circuit state. The first reference voltage Vref1 is greater than a rated voltage of the battery interface 11, so as to avoid misjudge a state of the electronic apparatus 10.

The power supplying unit 110a includes a power supply 240, a voltage switch 250 and a comparator 260. The power supply 240 is configured to provide the operation voltage VOP. The voltage switch 250 is coupled between the power terminal TP and the power supply 240, and receives a voltage providing signal SSP, so as to determine whether to provide the operation voltage VOP to the power terminal TP according to the voltage providing signal SSP.

The comparator 260 receives the device voltage VDE and a second reference voltage Vref2, and provides the voltage providing signal SSP according to a comparison result of the device voltage VDE and the second reference voltage Vref2. In other words, when the device voltage VDE is greater than the second reference voltage Vref2, the comparator 260 turns off the voltage switch 250 through the voltage providing signal SSP, i.e. the power supplying unit 110a does not provide the operation voltage VOP to the power terminal TP when the device voltage VDE is greater than or equal to the second reference voltage Vref2; and when the device voltage VDE is smaller than the second reference voltage Vref2, the comparator 260 turns on the voltage switch 250 through the voltage providing signal SSP, i.e. the power supplying unit 110a provides the operation voltage VOP to the power terminal TP when the device voltage VDE is smaller than the second reference voltage Vref2. The second reference voltage Vref2 is smaller than the rated voltage of the battery interface 11, so as to avoid misjudge the state of the electronic apparatus 10.

Figure 3:
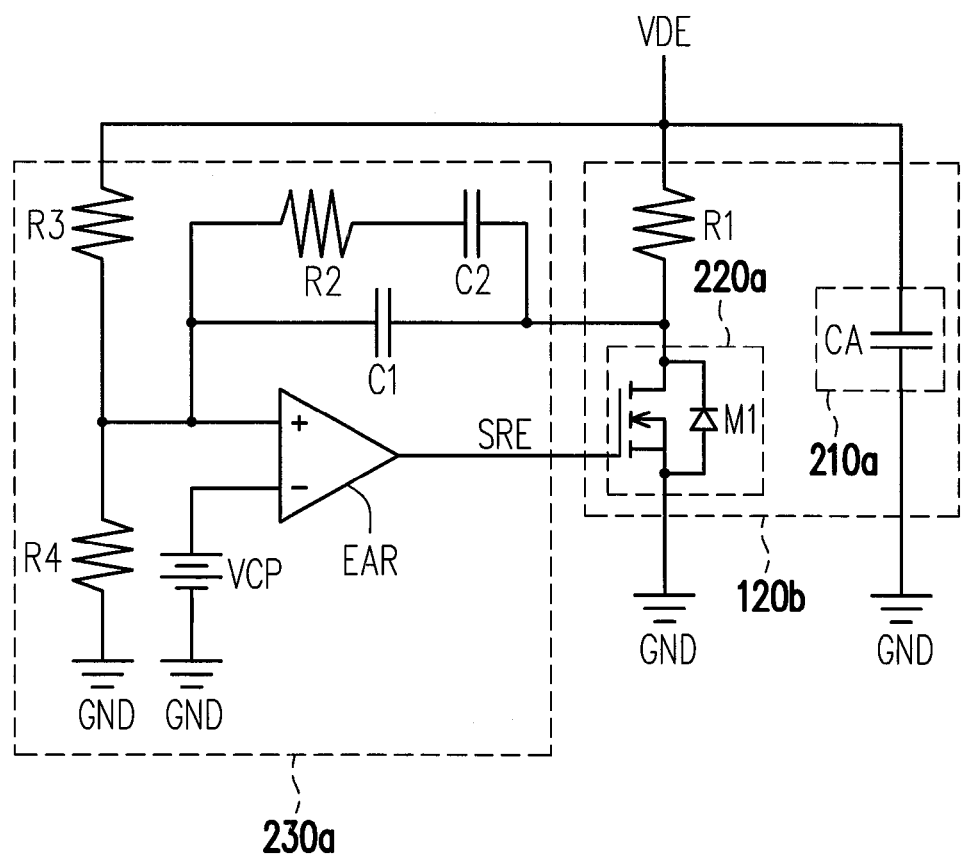
FIG. 3 is a circuit schematic diagram of a state regulating unit and an impedance unit according to an embodiment of the invention.

FIG. 3 is a circuit schematic diagram of a state regulating unit and an impedance unit according to an embodiment of the invention. Referring to FIG. 2 and FIG. 3, in which the same reference numbers denote the same or like components. In the present embodiment, the impedance unit 120b includes a first resistor R1, an energy storage element 210a and a pass element 220a, where the first resistor R1 and the pass element 220a are coupled in series between the power terminal (i.e. the power terminal TP shown in FIG. 1) and the ground voltage GND. Moreover, the energy storage element 210a, for example, includes a capacitor CA, and the pass element 220a includes a voltage-controlled pass element (for example, a transistor M1). A gate of the transistor M1 receives the impedance regulating signal SRI.

The error control unit 230a, for example, includes a first capacitor C1, a second capacitor C2, a second resistor R2, a third resistor R3, a fourth resistor R4 and an error amplifier EAP. A negative input terminal (corresponding to a second input terminal) of the error amplifier EAP receives a comparison voltage VCP, and an output terminal of the error amplifier EAP provides the impedance regulating signal SRI. The first capacitor C1 is coupled between a positive input terminal (corresponding to a first input terminal) of the error amplifier EAP and a junction of the first resistor R1 and the transistor M1 (i.e. the voltage-controlled pass element). The second capacitor C2 and the second resistor R2 are coupled in series between the positive input terminal of the error amplifier EAP and the junction of the first resistor R1 and the transistor M1. The third resistor R3 is coupled between the device voltage VDE and the positive input terminal of the error amplifier EAP. The fourth resistor R4 is coupled between the positive input terminal of the error amplifier EAP and the ground voltage GND. The comparison voltage VCP corresponds to the first reference voltage Vref1 times a voltage dividing ratio of the third resistor R3 and the fourth resistor R4, i.e. VCP=Vref1×R4/(R3+R4).

According to the above descriptions, when the device voltage VDE is increased, the impedance regulating signal SRI is used for reducing the impedance of the transistor M1, such that the device voltage VDE is decreased to be close to the first reference voltage Vref1; and when the device voltage VDE is decreased, the impedance regulating signal SRI is used for raising the impedance of the transistor M1, such that the device voltage VDE is increased to be close to the first reference voltage Vref1. However, when the electronic apparatus 10 does not supply power to the apparatus for simulating battery 100, the impedance adjustment of the transistor M1 cannot increase the device voltage VDE.

Moreover, switching of the transistor M1 probably causes a ripple of the device voltage VDE, and probably influence an operation of the error amplifier EAP, though the first capacitor C1, the second capacitor C2 and the second resistor R2 may feed back a transient state of a drain of the transistor M1 (i.e. feed back AC signal), so as to reduce the possibility of generating the ripple of the device voltage VDE and accelerate voltage convergence.

In summary, in the apparatus for simulating battery of the invention, the power supplying unit, the impedance unit and the state regulating unit provide the operation voltage or regulate the impedance of the impedance unit in response to a charge/discharge operation of the electronic apparatus performed on the battery, such that the electronic apparatus can normally operate. In this way, the operation of the battery is simulated through a simple circuit, so as to reduce the hardware cost for testing the electronic apparatus. Moreover, since the apparatus for simulating battery is composed of circuits, wear and tear of the battery is avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An apparatus for simulating battery, comprising:
a power supplying unit, coupled to a power terminal of a battery interface, and determining whether to provide an operation voltage to the power terminal according to a device voltage provided by the power terminal;
a state regulating unit, coupled to the power terminal, and providing a impedance regulating signal according to the device voltage, wherein the state regulating unit comprises an error control unit for receiving the device voltage and a first reference voltage, and providing the impedance regulating signal according to the device voltage and the first reference voltage, wherein the first reference voltage is greater than a rated voltage of the battery interface; and
an impedance unit, coupled between the power terminal and a ground voltage, and coupled to the state regulating unit to receive the impedance regulating signal, wherein the impedance unit regulates an impedance thereof according to the impedance regulating signal.

2. The apparatus for simulating battery as claimed in claim 1, wherein the impedance unit comprises:
a pass element, coupled between the power terminal and the ground voltage, and receiving the impedance regulating signal for adjusting an impedance thereof; and
an energy storage element, coupled between the power terminal and the ground voltage.

3. The apparatus for simulating battery as claimed in claim 2, wherein the pass element comprises a voltage-controlled pass element.

4. The apparatus for simulating battery as claimed in claim 2, wherein the energy storage element comprises a capacitor.

5. The apparatus for simulating battery as claimed in claim 1, wherein when the device voltage is smaller than the first reference voltage, the pass element presents an open-circuit state.

6. The apparatus for simulating battery as claimed in claim 5, wherein the impedance unit further comprises a first resistor, and the first resistor and the pass element are connected in series between the power terminal and the ground voltage.

7. The apparatus for simulating battery as claimed in claim 6, wherein the error control unit comprises:
an error amplifier, having a first input terminal, a second input terminal and an output terminal, wherein the second input terminal receives a comparison voltage, and the output terminal provides the impedance regulating signal;
a first capacitor, coupled between the first input terminal and a junction of the first resistor and the pass element;
a second capacitor and a second resistor, coupled in series between the first input terminal and the junction of the first resistor and the pass element;

a third resistor, coupled between the device voltage and the first input terminal; and a fourth resistor, coupled between the first input terminal and the ground voltage, wherein the comparison voltage corresponds to the first reference voltage times a voltage dividing ratio of the third resistor and the fourth resistor.

8. The apparatus for simulating battery as claimed in claim 1, wherein the power supplying unit provides the operation voltage to the power terminal when the device voltage is smaller than a second reference voltage.

9. The apparatus for simulating battery as claimed in claim 8, wherein the power supplying unit comprises:

a power supply, configured to provide the operation voltage;

a voltage switch, coupled between the power terminal and the power supply, and receiving a voltage providing signal; and a comparator, receiving the device voltage and the second reference voltage for providing the voltage providing signal.

10. The apparatus for simulating battery as claimed in claim 8, wherein the second reference voltage is smaller than the rated voltage of the battery interface.

* * * * *